Oct. 20, 1970 W. E. ENGELER 3,535,600

MOS VARACTOR DIODE

Filed Oct. 10, 1968 2 Sheets-Sheet 1

Inventor:
William E. Engeler,
by John F. Ahern
His Attorney.

MOS VARACTOR DIODE

Inventor:
William E. Engeler,
by John F. Ahern
His Attorney.

3,535,600
MOS VARACTOR DIODE

William E. Engeler, Scotia, N.Y., assignor to General Electric Company, a corporation of New York Filed Oct. 10, 1968, Ser. No. 766,491
Int. Cl. H01l 3/00
U.S. Cl. 317—235 11 Claims

ABSTRACT OF THE DISCLOSURE

A varactor diode (voltage dependent capacitance) is made utilizing a MOS (Metal-Oxide-Semiconductor) structure. In order to obtain a very high $dC/dV$ characteristic, a self-registered, opposite-conductivity source region is surface-diffused into the base region of the MOS structure surrounding the metal capacitor plate. This region is electrically connected to the base. In operation, the application of a sufficient voltage across the capacitor causes charge carriers of conductivity-type opposite to that of the base region to be drawn from the opposite-conductivity diffused source region into the base region beneath the metallic film, increasing the charge thereat at a rapid rate. The region becomes conductivity-inverted, and $dC/dV$ in the inversion region of the C–V curve is high. Operation of the capacitance in this region permits high sensitivity and high frequency operation.

The present invention relates to semiconductor varactor diodes, and more particularly, to such devices as utilize the MOS type structure for attainment of a very sensitive voltage variable capacitance characteristic.

The present invention is related to copending application Ser. No. 766,605 and my copending application Ser. No. 766,546 both assigned to the assignee of the present invention, and filed concurrently herewith.

The invention also relates to, and incorporates some of the technology of application Ser. No. 675,228—Brown et al. and application Ser. No. 679,957—Brown et al, both filed Oct. 13, 1967 and assigned to the assignee of the present invention, the disclosures of which are incorporated herein by reference thereto.

A varactor diode, or voltage variable capacitance is a device, the capacitance of which varies with the voltage applied across the terminals thereof. One type of voltage variable capacitor or varactor diode utilizes the MOS structure, namely, that in which a metal electrode is superposed over a major surface of a semiconductor body and separated therefrom by an insulating dielectric, generally an oxide, as for example, a silicon dioxide formed upon a silicon semiconductor wafer with a metallic electrode applied thereover. Hence, the Metal-Oxide-Semiconductor, or MOS, structure.

In such MOS varactor device, a relatively-high resistvity layer or body of semiconductor underlies the metal MOS plate. Assuming a P-type high-resistivity body, upon the application of a relatively negative potential thereto, positive charges accumulate under the MOS electrode and the maximum capacitance of the device is realized. As the voltage applied to the MOS plate becomes more nearly that of the polarity of the majority charge carriers within the body, i.e. in this instance more nearly positive, the capacitance drops as the material underlying the MOS contact becomes depleted of charge carriers and, thus, the effective thickness of the dielectric increases. It is this phenomenon of depletion of charge carriers to form a variable width dielectric that results in the variable capacitance of the conventional MOS varactor diode.

Although such devices are useful in many instances, there are certain disadvantages thereto. Initially, a severe disadvantage is encompassed by the fact that the change in capacitance with voltage ($dC/dV$) is greater as the resistivity of the semiconductor material immediately below the MOS electrode is increased. Such increase, however, results in the placing of a series resistance in the circuit and this greatly limits the speed with which the capacitance may be changed, in addition to the added disadvantage of the added resistance in the circuit, per se. Additionally, the rate of change of capacitance with voltage is not as large as is desirable when operating on the depletion curve of a MOS varactor.

Accordingly, one object of the present invention is to provide a voltage variable capacitance in which the rate of change of the capacitance with voltage is high.

Still another object of the present invention is to provide a voltage variable capacitance having a relatively low series resistance.

A further object of the invention is to provide a MOS varactor whose operating point is on the inversion portion of the C–V curve.

Yet another object of the present invention is to provide improved variable capacitance devices, the capacitance of which varies as a function of the applied voltage having high speed of operation, increased rate of change of capacitance with voltage, and low resistance characteristics.

Briefly stated, in accord with one embodiment of the present invention, I provide a MOS varactor diode having a thin, high resistivity region over a low resistivity substrate and an insulated metallic plate constituting a MOS electrode separated therefrom by a thin oxide film. A self-registered source region, of opposite-conductivity type to the high resistivity semiconductor body is surface-diffused thereinto, at least partially surrounding the MOS electrode. The surface-diffused source region serves as a source and sink of conduction carriers which, upon the application of an appropriate voltage thereinto in connection with the application of a voltage to the varactor diode, greatly increases, at a rapid rate, the charge concentration within the dielectric of the capacitor, thereby greatly increasing and decreasing the capacitance thereof at a rapid rate as a function of applied voltage.

The novel features believed characteristic of the present invention are set forth in the appended claims. The invention itself, together with further objects and advantages thereof may best be understood with reference to the following detailed description taken in connection with the appended drawing in which, FIG. 1 is a vertical cross-sectional schematic view of a MOS varactor diode constructed in accord with one embodiment of the present invention.

Figure 1:
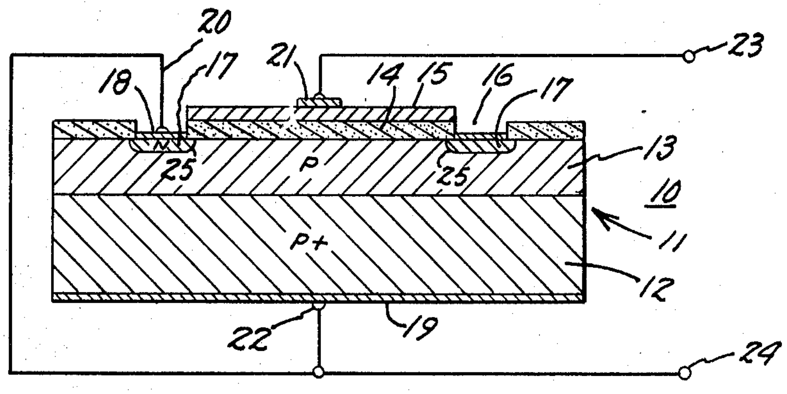

In FIG. 1, a device, having circular symmetry, constructed in accord with one embodiment of the present invention constitutes a varactor diode represented generally as 10 and comprises a silicon semiconductive wafer 11 including a substrate of a low resistivity region 12 of, for example, silicon doped with approximately $10^{19}$ atoms per cc. of boron and possessing P-type conductivity characteristics with a resistivity of approximately 0.01 ohm-cm. Atop substrate 12, a layer 13 is formed, as for example by epitaxial growth as for example by the process described in U.S. Pat. No. 3,316,130—Taft et al., and comprising for example a high-resistivity P-type silicon region containing approximately $1.5 \times 10^{17}$ atoms of boron per cc. and exhibiting a resistivity of approximately 0.2 ohm-cm. A thin film of approximately 1,000 AU thickness of silicon dioxide is formed over epitaxial layer 13, as for example, by thermally growing the film from the wafer by heating the wafer to a temperature of approximately 1,000° C. in an atmosphere of pure dry oxygen, as is described in greater detail in the aforementioned applications of Brown et al.

A metallic MOS capacitor electrode or plate 15 is formed upon layer 13 by covering the entire surface thereof with a 5,000 AU, for example, thick film of molybdenum, for example, formed by sputtering while the wafer is maintained at a temperature of approximately 500° C. in an atmosphere of argon in a triode sputtering apparatus with a molybdenum source as the target. This may be accomplished in a matter of approximately one-half hour. After the deposition of the molybdenum film, the portion of the film which is to comprise MOS electrode or plate 15 is masked by photolithographic techniques, as is well known in the art, by depositing a photoresist over the entire layer and irradiating only that portion corresponding with the electrode 15 and developing the photoresist to remove the unirradiated portions. The wafer is then immersed in a suitable etchant for molybdenum, as for example, an etchant comprising approximately 76 percent orthophosphoric acid, 6 percent glacial acetic acid, 3 percent nitric acid, and 15 percent water, which etches at a rate of approximately 5000 AU in 1.5 minutes to effectively remove therefrom the molybdenum film at annulus 16 without affecting the oxide therebetween.

The remaining molybdenum is then utilized as a diffusion mask to form a self registered, surface-diffused annular source region 17 at least partially surrounding and slightly undercutting molybdenum film 15 and the portion of oxide film 14 thereunder. Such formation of self-registered, surface-diffused source regions in semiconductor bodies of the MOS structure is set forth and claimed in the aforementioned application, Ser. No. 675,228 of Brown et al. Generally, this may be accomplished in the case of the formation of an N-type region, for example, by depositing a 4,000 AU thick film of 1 percent phosphorus-doped silicon dioxide glass thereover by pyrolytic deposition. This may readily be accomplished by passing a mixed flow of argon having been bubbled through and saturated by a quantity of ethyl ortho silicate and an order of magnitude less quantity of argon saturated with and having been bubbled through a solution of triethyl phosphate. The mixed argon flow is passed over the wafer heated to approximately 800° C. for approximately seven minutes. Thereafter the wafer is heated to approximately 1,050° C. for eighty minutes to cause diffusion of phosphorus atoms to a depth of approximately 3,000 AU and extending approximately 3,000 AU under the electrode 15 and oxide 14.

After diffusion of the phosphorus into source region 17 to form an opposite conductivity N-type region which slightly undercuts and is in registration with the MOS plate or electrode 15, contact is made thereto and to the MOS electrode by etching through the doped glass and making electrical contact by well known aluminum evaporation, after aperturing by masking and etching, to form discrete contact 18 to source 17 and contact 21 to MOS electrode 15.

The device of FIG. 1 operates as a varactor diode substantially as follows: The source P-N junction 25 formed by the intersection of surface-diffused source region 17 with epitaxially-deposited, high-resistivity P-type region 13 is connected by lead 20 and contact 22 to the base of the MOS structure, and to the input voltage which is applied between MOS electrode 15 and a conductive electrode means 19 made to the base of wafer 11 through terminals 23 and 24, respectively. Upon the application of a voltage such that MOS electrode 15 is sufficiently positive with respect to conductive electrode means 19 to exceed an injection threshold, characteristic of the device parameters, positive conduction carriers are depleted from the channel region immediately below the MOS electrode 15. In accord with the present invention, minority conduction carriers, or electrons are injected from N-type region 25 into the region of epitaxial P-type layer 13 immediately beneath MOS electrode 15 in proportion to the voltage applied thereto. This injection does not occur immediately, but is dependent upon the many other parameters of the device, as for example, the magnitude of the voltage, and the conductivity of the P- and N-type regions, for example.

Figure 7A:
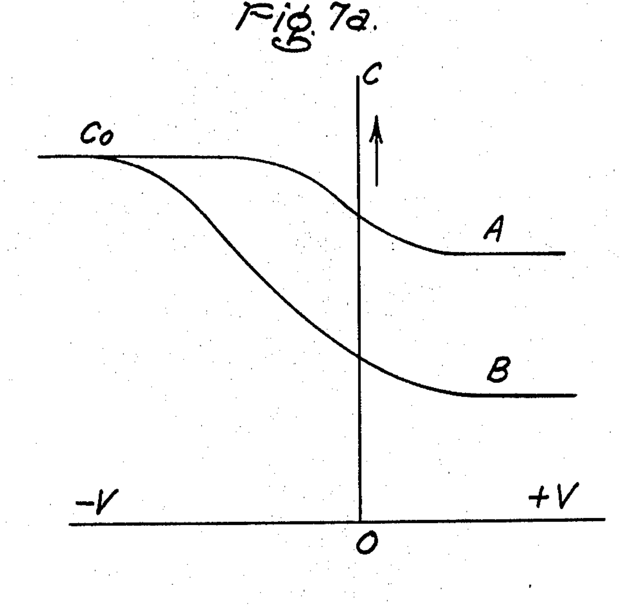
FIGS. 7*a* and 7*b* represent graphically the voltage-capacitance characteristics of devices in accord with the prior art, as contrasted with devices in accord with the present invention.
Figure 7B:
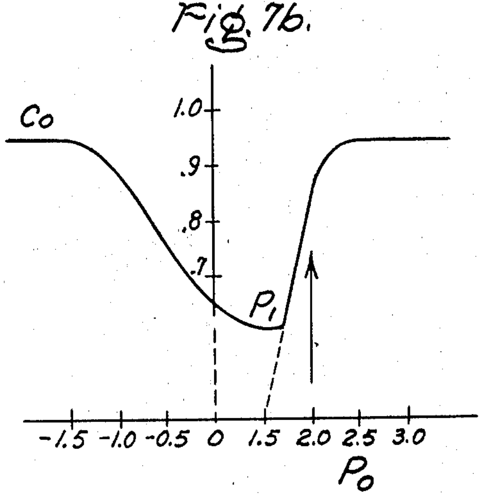

A graphical illustration of the operation of MOS varactor devices in accord with the prior art and the present invention is shown by the graphs of FIGS. 7*a* and 7*b*. In FIG. 7*a*, curve A represents the capacitance as a function of applied voltage of a conventional MOS structure such as that illustrated in FIG. 1 in which regions 17 were not present. In such circumstances a device having a low resistivity region 13 exhibits a relatively small change in capacitance as a function of voltage. Curve B illustrates the same type of curve for a device utilizing a high resistivity semiconductor region 13. As is evident by a comparison of Curve B with Curve A, a greater change of capacitance with applied voltage is obtained by utilizing the high resistivity substrate. On the other hand, a higher series resistance is introduced into the circuit with the aforementioned detriments.

By comparison, the curve of FIG. 7*b* shows the characteristics of a MOS varactor diode in accord with the present invention, wherein the device is operated at point $P_0$ indicated by an arrow pointing to the center of the linear portion of the inversion portion of the capacitance-voltage characteristic. As may be seen from the curve of FIG. 7*b*, the maximum value of capacitance, $C_0$, exists with a negative potential applied to the MOS electrode. As the potential becomes less negative, a depletion region begins to form beneath electrode 15 and becomes increasingly wider, decreasing the capacitance from $C_0$. The minimum capacitance is reached at a point at which the applied voltage is slightly positive with respect to the base electrode. At a point at which inversion occurs, indicated as $P_i$, injection of electrons from source region 17 into the surface adjacent region beneath MOS contact 15 rapidly causes an accumulation of charge with a high rate of change of capacitance as a function of voltage. The location of $P_i$ may be varied by other parameters of the device, but the general shape of the curve is the same no matter at which voltage inversion occurs.

Although the maximum value of capacitance on the inversion side of the capacitance minimum at $P_i$ is no greater than $C_0$, it should be noted that the rate of change of capacitance with voltage in the inversion region is much greater than in the depletion region, to the left of the inversion point. Accordingly, the operation of the device at $P_0$ makes it possible to obtain a high rate of change of capacitance as a function of voltage, as compared with MOS capacitors which operate in the depletion region.

In order that the devices of the present invention, in their optimum form, contribute most to any circuit in which they are contained, it is desirable, not only that the series resistance caused by the semiconductor between the capacitor plates be relatively low, but also that the fixed series capacitance be low in order that high rate of change of voltage may facilitate high-frequency and high-speed operation of the diode.

In order that this occur, the length of the distance between discrete portions of the surface diffused source region 17 be as small as possible so that opposite-conductivity-inducing charge carriers may rapidly be swept into and out of the inversion region of the high-resistivity semiconductor material beneath the MOS electrode. From a persual of FIG. 1, it is apparent that this schematic drawing does not satisfy, to any great degree, this objective. Such a device, designed to overcome the series resistance restriction of the schematic device illustrated in FIG. 1, is illustrated in plan view in FIG. 2 and in vertical cross section in FIG. 3, which view is taken along the line 3′–3″ in FIG. 2. In both figures, like numbers are used to identify like parts.

Figure 2:
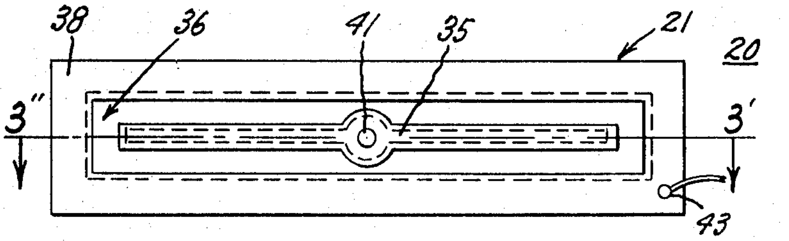
FIG. 2 is a plan view, in schematic, of an alternative embodiment of the device of FIG. 1.
Figure 3:
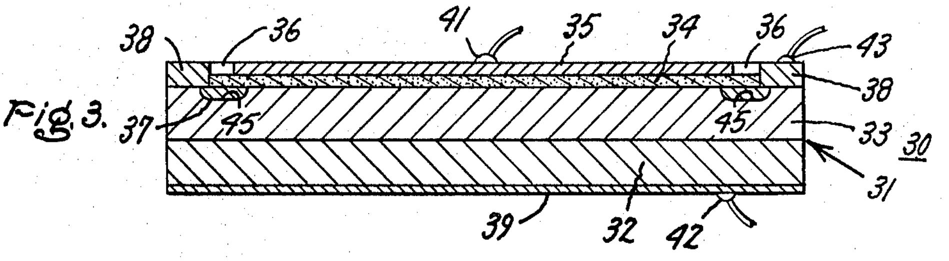
FIG. 3 is a vertical cross-sectional view of the device of FIG. 2 taken along the section line 3′–3″.

In FIGS. 2 and 3, the varactor diode represented, generally, as 30 comprises a monocrystalline semiconductor wafer, preferably of silicon, for example, having a low resistivity base member 32 which may, for example, be of P-type conductivity having a high concentration therein of an acceptor activator material, as for example, boron, of the order of $10^{19}$ atoms of boron per cubic centimeter thereof and exhibiting a resistivity of approximately 0.01 ohm-centimeter, for example. A high-resistivity region 33 which may, for example, be formed by diffusion of donor activator thereinto to compensate a portion of the acceptor-activator concentration, or, preferably, which may be formed by epitaxial-deposition of a higher resistivity, P-type silicon semiconductor in accord with the Taft et al. patent. Such a layer may contain, for example, an acceptor concentration of, approximately $1.5\times10^{17}$ atoms per cubic centimeter of boron and exhibit a resistivity of approximately 0.2 ohm-centimeter.

As with the device of FIG. 1, a thin layer of an insulating dielectric, as for example, silicon dioxide, is formed over the exposed major surface of the high-resistivity P-type silicon region 33 and is patterned and etched so as to form an insulating layer overlying the active portions of the semiconductor wafer. Such a layer is illustrated at 34 and covers the entire major surface of wafer 31, initially. This layer may be formed by heating the wafer, maintained at a temperature of approximately 1000° C., in an atmosphere of pure dry oxygen for approximately 80 minutes to form a 1000 AU thick silicon dioxide layer on a silicon wafer.

A thin layer or film of a metal which is not reactive with the oxide film 34, as for example, molybdenum, tungsten, or any other of the metals set forth in the copending application Ser. No. 761,389 filed Aug. 16, 1968, assigned to the present assignee, preferably a refractory metal, is formed over the entire surface of the semiconductive wafer and the oxide film. This may be accomplished, for example, by sputtering, utilizing a molybdenum target in a triode sputtering apparatus with the wafer maintained at a temperature of approximately 500° C. Sputtering for approximately 30 minutes is sufficient to form a molybdenum film approximately 5000 AU thick.

After the 5000 AU thick molybdenum film has been formed, an aperture is etched therein, corresponding with aperture 36 in FIGS. 2 and 3. This may be done, conveniently, by covering the entire surface of the molybdenum film with a photoresist and masking a region corresponding to aperture 36, irradiating the photoresist with ultraviolet light and developing it while washing away the portion thereof corresponding with aperture 36 to form an aperture therein. After formation and developing of the photoresist film, the wafer is immersed in an etchant for the material constituting the metallic film 35. A ferricyanide etch is suitable for etching tungsten. Molybdenum may be etched at a rate of 5000 AU in 1.5 minutes by a netch consisting essentily of 76 percent orthophosphoric acid, 6 percent glacial acetic acid, 7 percent nitric acid, and 15 percent water. After etching in such an etchant for approximately one and one-half minutes, the wafer is removed, washed in distilled water, and the photoresist is removed, as for example, with a photoresist stripper.

The wafer is then treated to cause the diffusion of opposite conductivity-inducing-activator materials through aperture 36 in molybdenum film 35 and through the undisturbed portion of oxide layer 34 to form conductivity-modified, surface-adjacent source region 37. When wafer 31 as a P-type wafer, source region 37 may be formed by the diffusion of phosphorus therein. This may be accomplished by depositing a layer of approximately 3000 AU thick of phosphorus-doped silicon dioxide over the wafer and diffusing therefrom. This may be accomplished by pyrolitic deposition from a mixture of ethyl orthosilicate and triethyl phosphate from a flowing saturated argon gas mixture, while the wafer is heated to a temperature of approximately 800° C. Such deposition is described in greater detail in the copending applications of Brown et al., Ser. No. 675,228 and Brown et al. Ser. No. 679,957, both of which were filed Oct. 13, 1967, and assigned to the assignee of the present invention and incorporated herein by reference thereto.

After the formation of a phosphorus-doped glass, for example, conveniently of approximately 3000 AU thick over the wafer, the wafer may be heated for approximately 80 minutes while being held at a temperature of approximately 1050° C. in an argon atmosphere to cause a diffusion of phosphorus therein to a depth of approximately 3000 AU. Lateral diffusion also occurs beneath silicon dioxide film 34 to a distance of approximately 3000 AU.

The wafer is then processed by etching minute holes in the phosphorus-doped glass to make a first contact 41 to molybdenum film 35.

The doped oxide film is patterned by conventional photolithographic techniques to remove the peripheral portion thereof coextensive with the region to be contacted by electrode means 38, including a portion of region 36 as illustrated in FIGS. 2 and 3. This may be done by coating the wafer with a photoresist, etching away the photoresist in the region of electrode 38 and a portion of region 36, developing the remainder to simultaneously remove the photoresist from the region of electrode 38 and immersing the wafer in an etch for silicon dioxide as, for example, buffered HF, until the silicon of wafer 31 is exposed thereat.

After removal of silicon dioxide in the unmasked portion, the exposed peripheral portion of the molybdenum film and the oxide thereunder are then removed by successive etchings in molybdenum etchant, as above, and in buffered HF. A film of aluminum is deposited over the wafer by evaporation, for example, to form electrode 38. The excess aluminum is removed when, subsequent to its deposition, the wafer is immersed in a photoresist stripper, for example and scrubbed, removing both the photoresist and the aluminum deposited thereon. A second contact 43 is made to electrode 38. The base region 32 of the diode may be contacted with an aluminized film and a contact 42 made thereto. As in the aforementioned Brown et al. applications, contacts 41 and 43 are made by appropriate masking with a photoresist and evaporation of aluminum into apertures cut in the phosphorus-doped glass to contact electrodes 35 and 38, respectively.

The device illustrated in FIG. 2 and FIG. 3, as formed by the aforementioned process, functions quite effectively as a variable capacitance diode having low series fixed capacitance. As is illustrated in FIG. 3, the area of contact between the opposite-conductivity region in area 36 completely surrounds the MOS electrode 35 and, since the MOS electrode 35 has a very thin cross section and a relatively large longitudinal dimension, it is ideally suited to have carriers which are injected from source junction 45 rapidly swept beneath, and from beneath, MOS electrode 35 as the voltage applied between contacts 41 and 42 is varied.

In operation, contacts 42 and 43 may be connected together to form one contact of a MOS varactor diode and contact 41 serves as the opposite contact thereof. This is not necessary, however, since layer 38, overlapping surface-diffused, opposite-conductivity source region 37 and the high resistivity base region 33 of wafer 31 provides an internal connection between the base region, as represented by electrical contact 39 of the varactor diode, so that contact to electrode 42 is, in essence, making contact to electrode 43 as well. It may be convenient, however, to provide an external connection to eliminate any series resistance therebetween.

Figure 4:
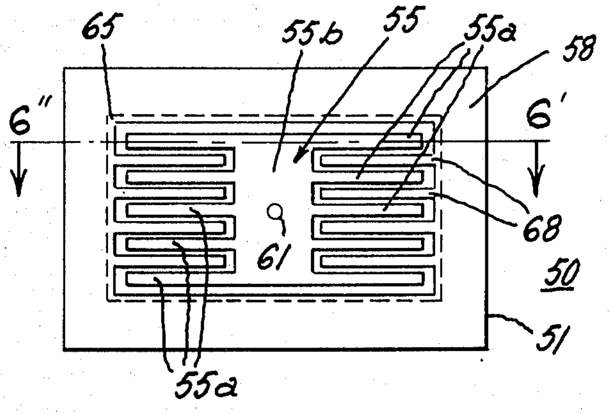
FIG. 4 is a plan view of yet another alternative embodiment of the invention.
Figure 5:
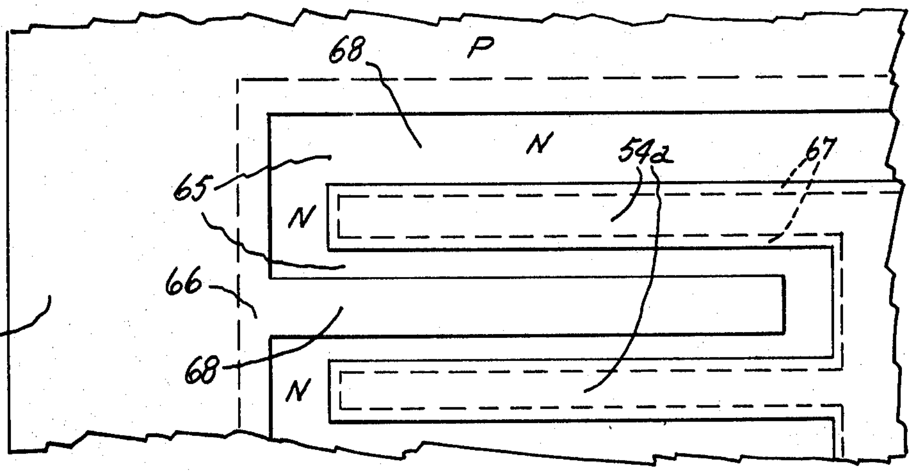
FIG. 5 is a blown-up illustration of a portion of the device illustrated in FIG. 4 showing greater detail thereof.
Figure 6:
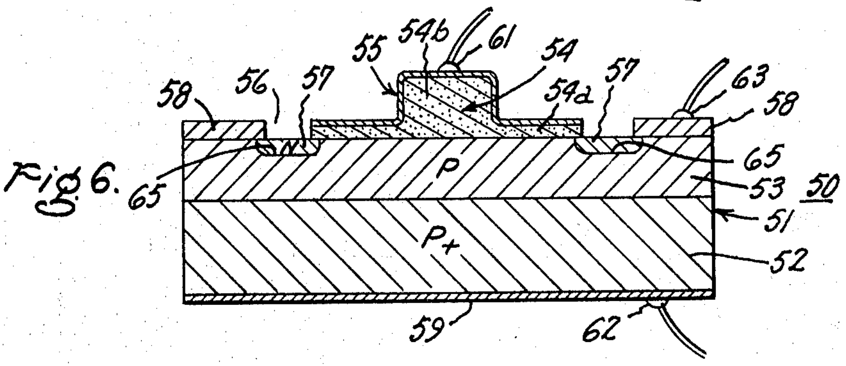
FIG. 6 is a vertical cross-sectional view of a portion of the device of FIG. 4 taken along section line 6′–6″.

While the embodiment of the invention illustrated in FIGS. 2 and 3 describes, in its simplest form, the rapid responsive, high frequency, low fixed series capacitance embodiment of the invention, one preferred structure for a varactor diode in accord with the present invention utilizing certain improved techniques is illustrated in plan view in FIG. 4 and in elevation view in cross section in FIG. 6. Similarly, an enlarged partial portion of FIG. 4 is shown in FIG. 5.

As may be seen from the plan view of FIG. 4 and the elevation view of FIG. 6, varactor diode 50 comprises a monocrystalline wafer 51 having a substrate region 52 of high-conductivity, P-type silicon doped with boron, for example, upon which there is formed an epitaxial layer of high-resistivity, P-type boron-doped silicon. An opposite-conductivity-type induced surface-adjacent source region 57 is formed into the epitaxial grown region 53 of wafer 52 and slightly undercuts molybdenum electrode 58 which surrounds the periphery of the upper surface of the wafer and oxide 54 and the overlying film 55 of molybdenum in registry therewith. As may be seen with greater particularity in FIGS. 4 and 5, the MOS electrode includes a central portion **54*b* and a plurality of thin-finger-like members 54*a* into which finger-like portions 68 of source electrode 58** are interdigitated.

As may be seen with greater particularity in the blown-up portion of FIG. 4 shown in FIG. 5, fingers **54*a* of MOS electrode 54 are interdigitated between fingers 68 of source contact 58 which are in contact with both N-type and P-type portions of the surface of the wafer. Surface-diffused, opposite-conductivity-type source region 57 lies beneath fingers 68 of source contact 58 and slightly undercuts the exterior peripheral portions of contact 58 as indicated by the dotted portion enclosed within region 66. Source region 57 also undercuts fingers 54*a* of MOS electrode 54 as indicated by the dotted line portions indicated at 67 of FIG. 5. The degree of undercutting of fingers 54*a* of electrode 54 is approximately equal to the depth of diffusion into high-resistivity, P-type region 53 of wafer 51**.

Another feature of this embodiment of the invention is illustrated in greater detail in FIG. 6, which is a schematic vertical cross-sectional view of the device. From FIG. 6 it may be seen that the oxide underlying MOS electrode 55 has a thick region **54*b* which is central, and from which extend a plurality of thin regions 54*a*, which underlie the fingers 55*a* illustrated in detail in FIG. 4 and FIG. 5. The thin regions of the oxide constitute those portions which actively serve to passivate the intersection of P–N junction 65 between surface-adjacent, opposite-conductivity-type source region 57 and P-type region serves as a support for that portion of MOS electrode 55** upon which a good and substantial ohmic contact is made, as for example, by thermobonding.

The device illustrated schematically in FIGS. 4, 5 and 6 may be constructed substantially as follows.

A monocrystalline wafer of silicon exhibiting a resistivity of 0.001 ohm. centimeter, having P-type conductivity induced by boron doping to a level of approximately $10^{20}$ atoms per cubic centimeter is used as the starting substrate. A two-micron thick epitaxial layer of silicon is grown, as is well known to the art, by silicon tetrachloride decomposition thereupon. The epitaxial film contains a concentration of boron of approximately $1.5 \times 10^{17}$ atoms of boron per cubic centimeter and exhibits a resistivity of approximately 0.2 ohm-centimeter. A thick silicon dioxide film of approximately 1 micron thickness is grown thereupon by heating the wafer to approximately 1000° C. and maintaining it at that temperature in an atmosphere of pure dry oxygen for approximately 60 hours. The film is coated with a photoresist and patterned so as to have only a portion corresponding to central portion **54*b* of film 54** covered when the photoresist is developed and the wafer etched. Subsequent thereto, a thin film of silicon dioxid of approximately 400 AU is formed over the entire unoxidized portions of the wafer, the photoresist having been removed. This may be accomplished by heating the wafer to approximately 1000° C. in an atmosphere of pure dry oxygen for approximately one-half hour and subsequently heating for two hours in helium for annealing purposes at 1000° C.

After annealing the thin oxide layer, a 5000 AU thick layer of molybdenum is sputter-coated, as described hereinbefore, over the entire wafer with th wafer at approximately 500° C. A pattern corresponding to MOS electrode 54 is formed in a photoresist over the molybdenum film bywell-known techniques, the fingers of the pattern being approximately one-eighth mil wide and approximately five mils long and the central portion being approximately three mils by five mils. Conveniently, ten fingers may be formed, having a spacing of approximately 0.75 mil between fingers. The photoresist mask also covers the peripheral portion 58 of the molybdenum film so that the distance between the outer portion of pattern 54 and peripheral portion 58 is a matter of two or three mils. After the formation of such a pattern over the molybdenum, the molybdenum is etched in the molybdenum etchant as is set forth hereinbefore.

After etching of the molybdenum to form the separation between the central portion and the peripheral portion, phosphorus-doped glass, containing about one percent phosphorus in silicon dioxide, is then deposited to a thickness of approximately 3000 AU over the entire wafer. The wafer is then heated at a temperature of approximately 1050° C. in argon for approximately 40 minutes to cause the phosphorus to diffuse through the 400 AU thick film of redeposited silicon dioxide and approximately 3000 AU deep into the high-resistivity P-type region of the wafer and lapping approximately 3000 AU under the edge of the fingers and under the inner edge of the peripheral portion 38 remaining. The sheet resistance of the N-type surface-diffused source region so formed is approximately 30 ohms per square.

Subsequent to the diffusion of the N-type source region in the surface of the P-type portion of wafer 51, a photoresist layer is formed over the wafer and is patterned, as is conventional, to expose the regions betwen th molybdenum fingers **54*a*, leaving a spacing of approximately 0.2 mil surrounding the fingers 54*a* covered. A central portion 61 of region 54*b* is also exposed, so that after the formation of the pattern and etching the silicon oxide between the fingers 54*a* of the molybdenum plate 54 and after removal of the peripheral molybdenum and oxide a central contacting portion of region 54*b* is exposed. After etching, removing of the photo-resist pattern, and rinsing, the wafer is then covered with an evaporated aluminum film of approximately 5000 AU thickness and heated to approximately 550° C. for 10 to 15 minutes to form essentially ohmic contacts to both the N-type diffused silicon regions between fingers 54*a* and to the peripheral P-type region, thus forming contacts 68 to the N-type source region between fingers 54*b* and contact 58 to the N-type source region between fingers 54*b* and contact 58 in contact with the P-type base region, overlapping the N-type diffused source region. Individual aluminum contact portions are separated by masking and etching. Thermo-compression bonds are then made to the aluminum covering molybdenum central portion 54***b* at 61 and to aluminum contact 58.

In forming devices in accord with the present invention, the pattern hereinbefore described may be repeated a large number of times over a single wafer for the purpose of forming a plurality of devices. Prior to the formation of thermo-compression bonds, the individual devices may be separated and tested. Other interdigitated patterns may be formed, for example a radial configuration, a serpentine configuration, or interleaved E*s* may be fabricated. The thick-thin oxide structure may be used without the interdigitated structure, as may the latter without the former.

Units fabricated, as described hereinbefore, typically exhibit an equilibrium capacitance value of approximately three pfd and a $dC/dV$ of approximately 0.3 pfd per volt and have a surface mobility of approximately 400 $cm.^2$/volt-sec. when operated the order of a volt above the minimum capacity in the inversion region, as is indicated by point $P_0$ in FIG. 7*b*. Such devices are capable of operating at frequencies of approximately one gHz. Even higher frequencies may be obtained by the narrowing of the width of molybdenum fingers 55*a*. Larger values of capacitance may be obtained by increasing the number of fingers or the length thereof.

Additionally, the maximum capacitance of such devices, $C_o$, is affected by the thickness of the insulation between the MOS electrode and the semiconductor, as well as the resistivity of the surface adjacent or active portion of the semiconductor, as described hereinbefore. The frequency response of the device is linearly proportional to the surface mobility and inversely proportional to the square of the greatest distance which must be traversed by a conduction carrier (approximately ½ the channel length). Since the frequency of operation depends upon $C_o$, and $dC/dV$, device parameters for devices constructed in accord with the invention for any given $dC/dV$ and operating frequency may be determined by virtue of these criteria, as is well-known to those skilled in the art.

Although the invention has been described specifically with respect to the formation of N-type source regions in a P-type silicon substrate by diffusion from phosphorus-doped glass formed by the deposition of phosphorus from triethyl phosphate, the opposite structures may be made. In such instances the original silicon wafer is phosphorus doped, and boron-doped glass is formed by pyrolytically decomposing triethyl borate and ethyl orthosilicate. The wafer is then heated to diffuse boron into the N-type base region to form P-type source regions.

While the invention has been set forth herein by way of example, by reference to certain preferred embodiments and specific examples thereof, many modifications and changes will readily occur to those skilled in the art. Accordingly, I intend by the appended claims to cover all such modifications and changes as fell within the true spirit and scope of the present invention.

What I claim as new and desire to secure by Letters Patent of the United States is:

1. A semiconductor voltage dependent capacitor comprising:

(a) a body of a semiconductive material of one-conductivity type having a major-surface-adjacent region;

(b) a film of an insulating dielectric overlying a portion of said major surface;

(c) a metallic film overlying at least a portion of said insulating film;

(d) a diffused conductivity-modified region of opposite-conductivity type within said semiconductor body at said major surface portion adjacent to and extending slightly under the edge of said insulating and metallic films and forming a P–N junction with said one-conductivity type region;

($d_1$) said conductivity-modified region including means for providing a source of conduction carriers of opposite sign to the conductivity sign of said one-conductivity type region and for injecting conduction carriers of the opposite type into said one-conductivity region beneath said metallic film thereby forming a surface-adjacent conductivity-inverted region of high charge concentration thereunder;

(e) conductive means contacting another surface of said one-conductivity region; and (f) means for applying a voltage between said metallic film and said conductive means sufficient for producing the conductivity inverted region whereby the capacitance of said capacitor is a highly sensitive high-speed function of said voltage.

2. A voltage variable capacitor comprising:

(a) a semiconductor body containing a major-surface-adjacent region of one-conductivity type;

(b) an insulating film overlying a portion of said major surface;

(c) a metallic film overlying at least a portion of said insulating film and comprising one plate of said capacitor;

(d) conductive means in electrical contact with another surface of said one-conductivity region and comprising the remaining plate of said capacitor;

(e) means for applying a voltage between said capacitor plates;

(f) means adjacent said metallic film for providing injection into the region of said one-conductivity type, in the area under said metallic film, the injection of conduction carriers of electrical charge opposite to the conductivity type of said one-conductivity region upon the application of a potential of electrical sign of said one-conductivity type and producing inversion of conductivity type in the area beneath the metallic film and thereby cause a rapid and large magnitude of change of capacitance with applied voltage across said capacitor.

3. A semiconductor voltage dependent capacitor comprising:

(a) a body of a semiconductive material of one-conductivity type having a major-surface-adjacent region;

(b) a film of an insulating dielectric overlying a portion of said major surface;

(c) a metallic film overlying and coextensive with said insulating film, ($c_1$) said metallic film constituting a first plate of said capacitor;

(d) a second plate for said capacitor comprising a metallic film in contact with the opposite major surface of said wafer to that contacted by said insulating dielectric;

(e) opposite-conductivity type means in registry with said first capacitor electrode and constituting source means for the injection of opposite-conductivity type conduction carriers beneath said first capacitor plate for producing conductivity inversion of said semiconductor body beneath said first capacitor plate whereby said capacitor exhibits a rapid rate of change of capacitance with applied voltage; and (f) conductive means in contact with the surface of said opposite-conductivity type source means.

4. The capacitor of claim 3 wherein said metallic film constituting a first capacitor plate has a large periphery to area ratio and all portions thereunder are adjacent said source.

5. The capacitor of claim 3 wherein said insulating dielectric includes a central thick portion and a plurality of narrow active regions extendnng therefrom.

6. The capacitor of claim 5 wherein said source means is formed to contain an undercut of the periphery of said narrow active regions.

7. The capacitor of claim 5 wherein said first metallic film and said conductive means in contact with said source means each have finger-like portions which are interdigitated.

8. The capacitor of claim 3 wherein said one-conductivity type material is silicone having a resistivity of the order of 0.1 ohm centimeter and said source means is opposite-type-conductivity silicon having a sheet resistance of the order of 30 ohms per square.

9. The capacitor of claim 8 wherein said one-type-conductivity silicon is doped with boron and said opposite-type-conductivity source is doped with phosphorus.

10. The capacitor of claim 1 wherein said one-conductivity-type silicon is doped with phosphorus and said opposite-conductivity-type source is doped with boron.

11. The device of claim 3 and further including means for applying a voltage to said MOS and second capacitor plates and simultaneously applying a voltage to said source means for injecting opposite type carriers into said one-conductivity-type semiconductor beneath said first capacitor plate for producing the conductivity inversion thereof.

References Cited

UNITED STATES PATENTS

| | | | |
|---|---|---|---|
| 3,056,888 | 10/1962 | Atalla | 317—235 X |
| 3,097,308 | 7/1963 | Wallmark | 317—234 X |
| 3,246,173 | 4/1966 | Silver | 317—234 X |
| 3,321,680 | 5/1967 | Arndt et al. | 317—234 |

JAMES D. KALLOW, Primary Examiner

U.S. Cl. X.R.

307—320